US009396079B2

(12) United States Patent
Ku

(10) Patent No.: US 9,396,079 B2
(45) Date of Patent: Jul. 19, 2016

(54) SEMICONDUCTOR MEMORY DEVICE AND SEMICONDUCTOR SYSTEM INCLUDING THE SAME

(71) Applicant: SK hynix Inc., Gyeonggi-do (KR)

(72) Inventor: Kie-Bong Ku, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 123 days.

(21) Appl. No.: 14/106,798

(22) Filed: Dec. 15, 2013

(65) Prior Publication Data

US 2015/0100837 A1 Apr. 9, 2015

(30) Foreign Application Priority Data

Oct. 7, 2013 (KR) .................... 10-2013-0119170

(51) Int. Cl.
*G11C 29/00* (2006.01)
*G06F 11/20* (2006.01)
*G11C 29/42* (2006.01)
*G11C 29/44* (2006.01)
*G06F 11/10* (2006.01)
*G11C 29/04* (2006.01)

(52) U.S. Cl.
CPC ........ *G06F 11/2094* (2013.01); *G06F 11/1048* (2013.01); *G11C 29/42* (2013.01); *G11C 29/4401* (2013.01); *G11C 29/78* (2013.01); *G11C 2029/0409* (2013.01); *G11C 2029/4402* (2013.01)

(58) Field of Classification Search
CPC .................................................... G06F 11/2094
See application file for complete search history.

(56) References Cited

U.S. PATENT DOCUMENTS

| 6,930,933 B2 * | 8/2005 | Jeon .............................. 365/200 |
| 2005/0128830 A1 * | 6/2005 | Nishihara .............. G11C 29/44 365/200 |
| 2008/0137454 A1 * | 6/2008 | Lee et al. ...................... 365/200 |

FOREIGN PATENT DOCUMENTS

| KR | 100244506 | 2/2000 |
| KR | 1020060022144 | 3/2006 |
| KR | 1020070072229 | 7/2007 |

* cited by examiner

*Primary Examiner* — Sam Rizk
(74) *Attorney, Agent, or Firm* — IP & T Group LLP

(57) ABSTRACT

A semiconductor memory device includes a memory cell array including a normal region for storing a plurality of data, an error information region for storing a plurality of error information data corresponding to the plurality of normal data, respectively, and a redundancy region for replacing the normal region, an error detection unit suitable for detecting an error on the plurality of data in response to the plurality of error information data, and storing an error location information, which indicates a storage region of a data having an error in the normal and redundancy regions, based on an error detection result, and a repair operation unit suitable for replacing the storage region, which is indicated by the error location information, by the redundancy region during a repair operation period.

19 Claims, 4 Drawing Sheets

SEMICONDUCTOR MEMORY DEVICE AND SEMICONDUCTOR SYSTEM INCLUDING THE SAME

CROSS-REFERENCE TO RELATED APPLICATIONS

The present application claims priority of Korean Patent Application No. 10-2013-0119170, filed on Oct. 7, 2013, which is incorporated herein by reference in its entirety.

BACKGROUND

1. Field

Exemplary embodiments of the present invention relate to a semiconductor design technology, and more particularly, to a semiconductor memory device and a semiconductor system including the same for performing a repair operation on a memory cell.

2. Description of the Related Art

In general, as the capacity of a semiconductor system increase, the reliability and yield of the semiconductor system may deteriorate. Thus, the semiconductor system improves the reliability and yield thereof by adding an error correcting code (ECC) to data and repairing an error of a defective memory cell.

FIG. 1 is a block diagram illustrating an ECC circuit of a typical semiconductor memory device. Referring to FIG. 1, the typical semiconductor memory device includes a memory cell array 100, a data put/output unit 140 and an ECC circuit 120.

The memory cell array 100 stores input data DATA and outputs data DATA, which is stored on the memory cell array 100.

The data input/output unit 140 receives the input data DATA, which is provided from an external device (not shown), and transmits the input data DATA to the memory cell array 100. The data input/output unit 140 outputs data DATA, which is outputted from the memory cell array 100, to the external device.

The ECC circuit 120 determines whether an error occurs in data DATA stored on the memory cell array 100, and corrects the error when the data DATA is outputted from the memory cell array 100 to the external device. The ECC circuit 120 also determines whether an error occurs in input data DATA, which is inputted to the memory cell array 100, and corrects the error. Thus, the reliability of the data DATA, which is inputted or outputted to/from the semiconductor memory device, may be improved.

However, since the ECC circuit 120 is added to the semiconductor memory device, an area of the semiconductor memory device increases. Moreover, since an operation of the ECC circuit is performed on the data, which is inputted or outputted to/from the memory cell array 100, if an error occurs in the data, it may be difficult to synchronize the data with an operation clock after the error is repaired.

SUMMARY

Exemplary embodiments of the present invention are directed to a semiconductor memory device and a semiconductor system for performing a repair operation based on an error occurrence of an output data.

Exemplary embodiments of the present invention are directed to a semiconductor system for repairing an error of data, which is inputted or outputted to/from a semiconductor memory device, while minimizing the use of resources, i.e., logic or delay circuits.

In accordance with an exemplary embodiment of the present invention, a memory cell array including a normal region for storing a plurality of data, an error information region for storing a plurality of error information data corresponding to the plurality of data, respectively, and a redundancy region for replacing the normal region, an error detection unit suitable for detecting an error on the plurality of data in response to the plurality of error information data, and storing an error location information, which indicates a storage region of a data having an error in the normal and redundancy regions, based on an error detection result, and a repair operation unit suitable for replacing the storage region which is indicated by the error location information, by the redundancy region during a repair operation period.

In accordance with an exemplary embodiment of the present invention, a semiconductor memory system includes a semiconductor controller suitable for generating a plurality of input data each including a data and an error information data for determining an error occurrence on the data, and a semiconductor memory device suitable for storing the plurality of input data during a write operation period, detecting error occurrences on a plurality of data in response to a plurality of error information data and storing an error location information, which indicates a storage region of a data having an error during a read operation period, and repairing the storage region indicated by the error location information during a repair operation period, wherein the semiconductor controller controls the repair operation period of the semiconductor memory device based on an error occurrence detected result transmitted from the semiconductor memory device during the read operation period.

DETAILED DESCRIPTION

Figure 1:
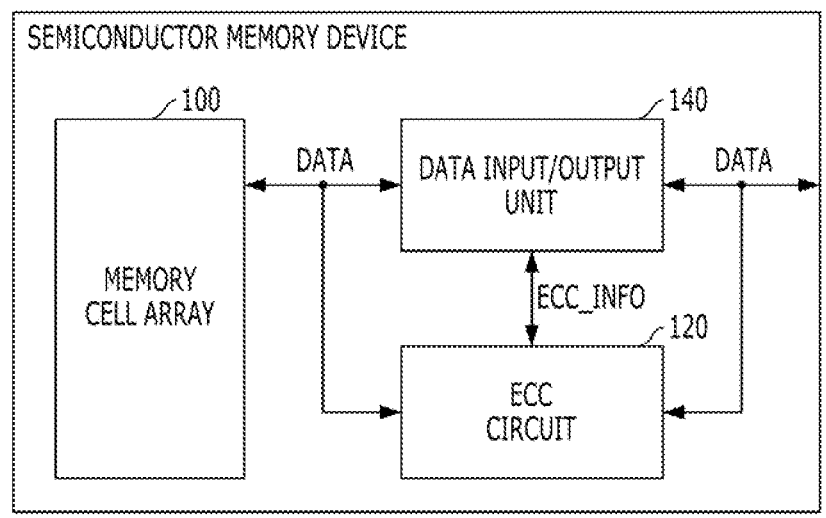
FIG. 1 is a block diagram illustrating an ECC circuit of a typical semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

It is also noted that in this specification, 'and/or' represents that one or more of components arranged before and after 'and/or' are included. Furthermore, "connected/coupled" refers to one component not only directly coupling another component but also indirectly coupling another component through an intermediate component. In addition, a singular form may include a plural form as long as it is not specifically mentioned in a sentence. Furthermore, 'include/comprise' or 'including/comprising' used in the specification represents that one or more components steps, operations, and elements exist or are added.

Figure 2:
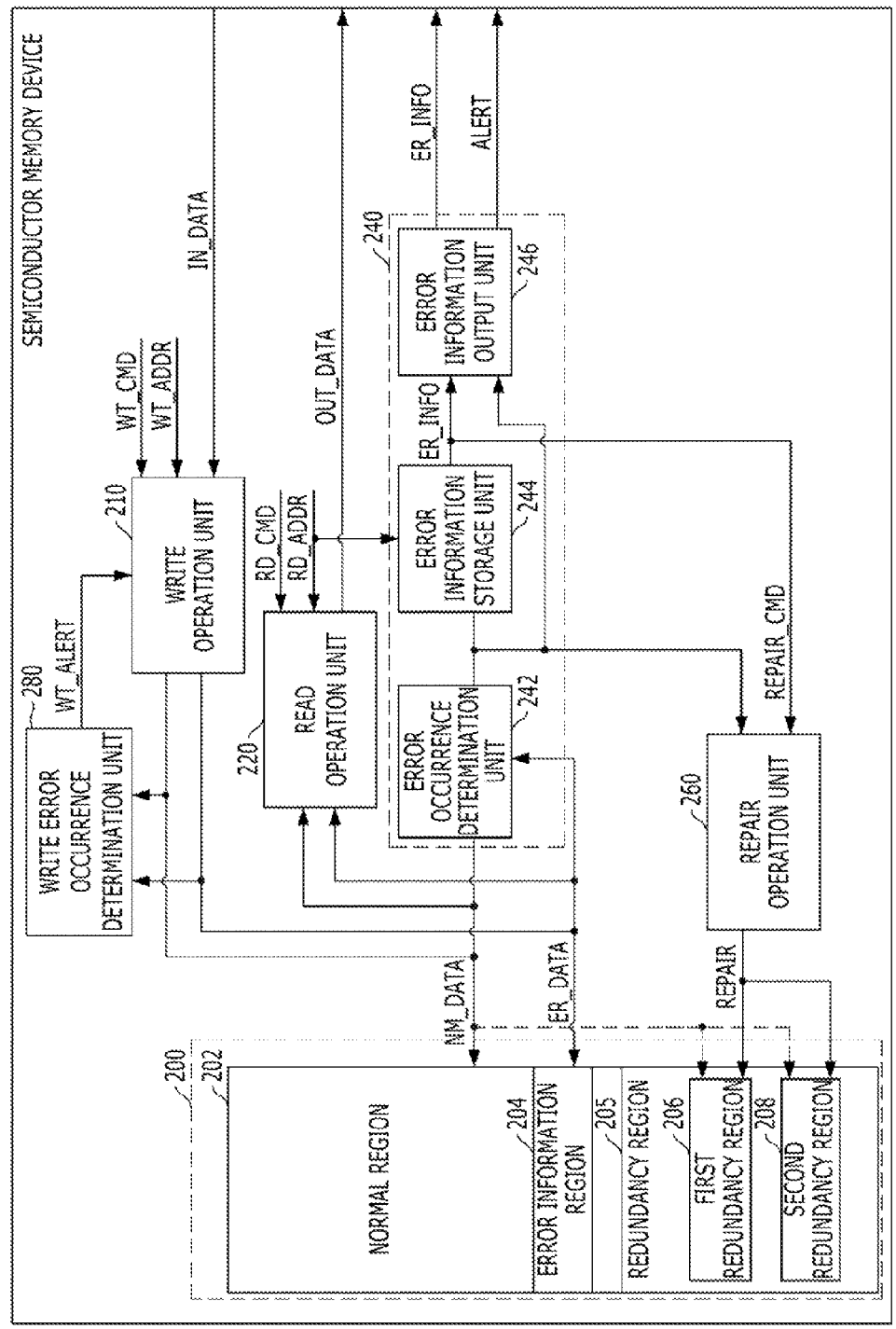
FIG. 2 is a block diagram illustrating a semiconductor memory device in accordance with an exemplary embodiment of the present invention.

FIG. 2 is a block diagram illustrating a semiconductor memory device in accordance with an exemplary embodiment of the present invention.

Referring to FIG. 2, a semiconductor memory device in accordance with an embodiment of the present invention includes a memory cell array 200, a write operation unit 210, a read operation unit 220, an error detection unit 240, a repair operation unit 260, and a write error occurrence determination unit 280.

The memory cell array 200 includes a normal region 202, an error information region 204, and a redundancy region 205.

The memory cell array 200 stores a plurality of normal data NM_DATA and a plurality of error information data ER_DATA corresponding to the plurality of normal data NM_DATA, respectively. The plurality of normal data NM_DATA are stored on the normal region 202. The plurality of error information data ER_DATA are stored on the error information region 204. The redundancy region 205 supports a repair operation on the normal region 202. That is, if an error occurs in the normal region 202 and the plurality of normal data NM_DATA are not stored on the normal region 202, the plurality of normal data NM_DATA may be stored on the redundancy region 205 replacing the normal region 202.

Herein, the plurality of normal data NM_DATA correspond to the plurality of error information data ER_DATA, respectively. For example, if a thousand number of normal data NM_DATA exist, a thousand number of error information data ER_DATA are used for determining the error occurrence of the plurality of normal data NM_DATA.

However, if each of the plurality of normal data NM_DATA includes N number of bits, each of the plurality of error information data ER_DATA includes M number of bits less than the N number of bits. For example, a single error information data ER_DATA having the M number of bits may be generated by decoding a single normal data NM_DATA having the N number of bits through a cyclic redundancy code (CRC) operation. Thus, a size of the normal region 202 for storing the plurality of normal data NM_DATA is larger than a size of the error information region 204 for storing the plurality of error information data ER_DATA.

The redundancy region 205 of the memory cell array 200 supports a repair operation of the normal region 202. When the repair operation is performed, the plurality of normal data NM_DATA may be stored on the redundancy region 205. In general, since the redundancy region 205 is smaller than the normal region 202, some of the plurality of normal data NM_DATA stored on the normal region 202 may not be replaced through the repair operation.

The redundancy region 205 includes a first redundancy region 206 and a second redundancy region 208. When the repair operation on the normal region 202 is performed, the first redundancy region 206 is used for replacing the normal region 202 prior to the second redundancy region 208. That is, when an error occurs in the normal region 202, the first redundancy region 206 is preferentially used. When a replaceable space does not exist on the first redundancy region 206, the second redundancy region 208 is used for replacing the normal region 202. Moreover, if an error occurs in the first redundancy region 206, the second redundancy region 208 replaces the first redundancy region 206.

Whenever input data IN_DATA having a set number of bits are received from an external device (not shown) during a write operation period, the write operation unit 210 stores some of the bits as one of the plurality of normal data NM_DATA on the normal region 202 or the redundancy region 205 of the memory cell array 200. The others of the bits as one of the plurality of error information data ER_DATA are stored on the error information region 204 of the memory cell array 200. Herein, the write operation period is an operation period defined by a write command signal WT_CMD. That is, when the write command signal WT_CMD and a write address signal WT_ADDR are provided from an external device (not shown), the semiconductor memory device enters the write operation period.

During the write operation period, some bits of the input data IN_DATA provided from the external device are stored as the normal data NM_DATA on a physical storage region of the redundancy region 205 or the normal region 202 corresponding to the write address WT_ADDR.

During the write operation period, the other bits of the input data IN_DATA are stored as the error information data ER_DATA on the physical storage region of the error information region 204 corresponding to the write address WT_ADDR.

Herein, a single input data IN_DATA includes a signal normal data NM_DATA and a signal error information data ER_DATA, which have a number of bits and are to be stored on the normal regions 202 (or the redundancy region 205) and the error information region 204, respectively. That is, the signal input data IN_DATA is to be written through a plurality of write operations.

Figure 4:
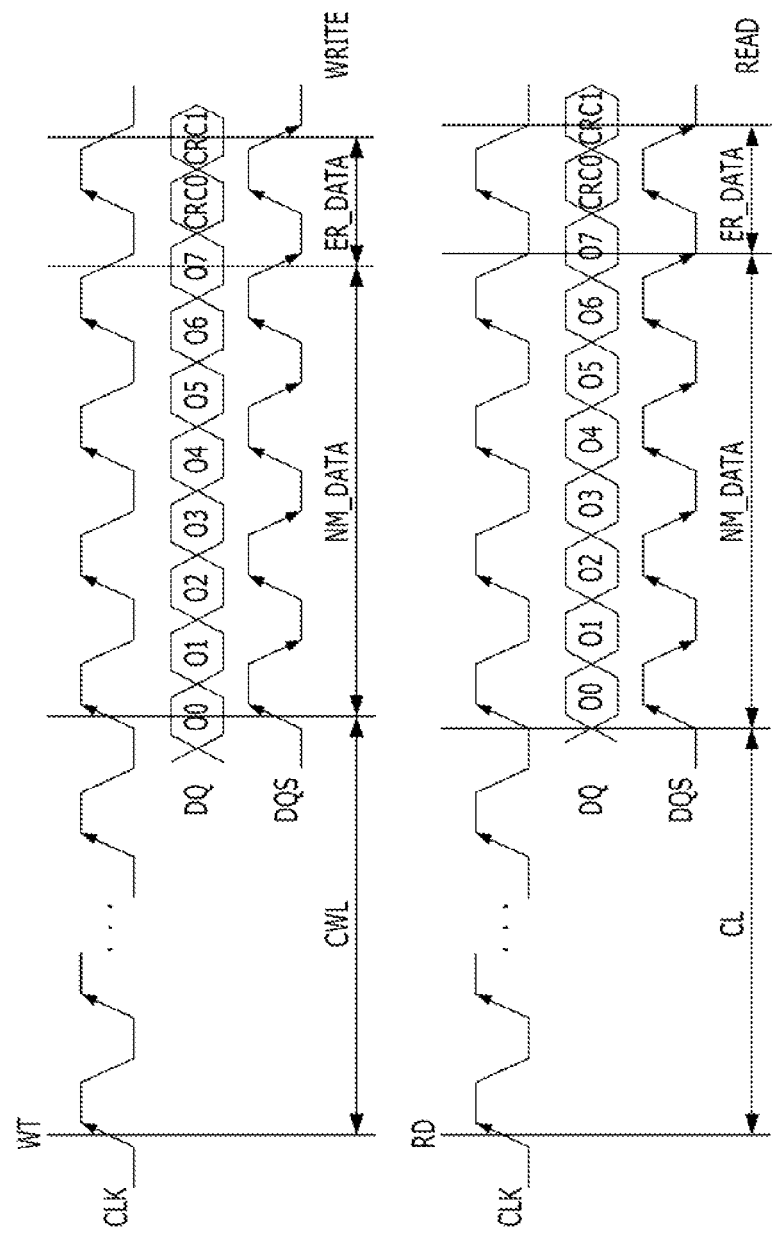
FIG. 4 is a timing diagram illustrating an exemplary structure of data inputted or outputted to/from a semiconductor memory device shown in FIGS. 2 and 3.

Referring to a 'WRITE' operation shown in FIG. 4, after a write command signal WT_CMD are received, and a predetermined latency interval CWL elapses, the input data IN_DATA includes a signal having ten bits, e.g., 00, 01, 02, 03, 04, 05, 06, 07, CRC0 and CRC1. Eight bits, e.g., 00, 01, 02, 03, 04, 05, 06 and 07, included in the input data IN_DATA as the normal data NM_DATA are stored on the normal region 202 or the redundancy region 205. Two bits, e.g., CRC0 and CRC1 except the eight bits of the input data IN_DATA as the error information data ER_DATA are stored on the error information region 204.

The read operation unit 220 selects one of the plurality of normal data NM_DATA, which are stored on the normal region 202 or the redundancy region 205 of the memory cell array 200, as a selected normal data NM_DATA. The read operation unit 220 selects one corresponding to the selected normal data NM_DATA out of the plurality of error information data ER_DATA, which are stored on the error information region 204 of the memory cell array 200, as a selected error information data ER_DATA. Output data OUT_DATA generated by combining the selected normal data NM_DATA and the selected error information data ER_DATA, are outputted to the external device.

Herein, the read operation period is defined by a read command signal RD_CMD. That is, when the read command signal RD_CMD and the read address RD_ADDR are provided from the external device, the semiconductor memory device enters the read operation period. During the read operation period, data, which are stored on a physical storage region corresponding to the read address RD_ADDR, out of the plurality of normal data NM_DATA stored on the normal region 202 or the redundancy region 205 of the memory cell array 200 are selected as the selected normal data NM_DATA. During the read operation period, data, which are stored on the physical storage region corresponding to the read address RD_ADDR, out of the plurality of error information data ER_DATA stored on the error information region 204 of the memory cell array 200 are selected as the selected error information data ER_DATA. Output data OUT_DATA generated by combining the selected normal data NM_DATA and the selected error information data ER_DATA are outputted to the external device. Herein, the single output data OUT_DATA includes the selected normal data NM_DATA and the selected error information data ER_DATA, which have a number of bits and have been stored on the normal regions 202 (or the redundancy region 205) and the error information region 204, respectively. That is, the signal output data OUT_DATA is to be read through a plurality of read operations.

Referring to a 'READ' operation shown in FIG. 4, after a read command signal RD_CMD is received, and a predetermined latency internal CL elapses, the single output data OUT_DATA includes a signal having ten bits, e.g., 00, 01, 02, 03, 04 05, 06, 07, CRC0 and CRC1. Eight bits, e.g., 00, 01, 02, 03, 04, 05, 06 and 07, included in the output data OUT_DATA as the selected normal data NM_DATA are outputted from the normal region 202 or the redundancy region 205. Two bits, e.g., CRC0 and CRC1 except the eight bits of the output data OUT_DATA as the error information data ER_DATA are outputted from the error information region 204.

The error detection unit 240 detects an error on the plurality of normal data NM_DATA outputted from the normal region 202 or the redundancy region 205 in response to the plurality of error information data ER_DATA outputted from the error information region 204 during the read operation period. As a detected result, the error detection unit 240 stores error location information ER_INFO, which indicates a physical storage region of the normal region 202 or the redundancy region 205 on which the data having an error are stored.

The error detection unit 240 includes an error occurrence determination unit 242, an error information storage unit 244, and an error information output unit 246.

The error occurrence determination unit 242 determines whether an error occurs in the selected normal data NM_DATA corresponding to the read address RD_ADDR out of the plurality of normal data NM_DATA outputted from the normal region 202 or the redundancy region 205 in response to the selected error information data ER_DATA corresponding to the read address RD_ADDR out of the plurality of error information data ER_DATA outputted from the error information region 204 during the read operation.

For example, if a value of the selected error information data ER_DATA is same as a value generated by encoding the selected normal data NM_DATA through the CRC operation, the error occurrence determination unit 242 determines that the error does not occur in the selected normal data NM_DATA, and inactivates an error determination signal ALERT. On the contrary, if the value of the selected error information data ER_DATA is not the same as the value generated by encoding the selected normal data NM_DATA through the CRC operation, the error occurrence determination unit 242 determines that the error occurs in the selected normal data NM_DATA, and activates the error determination signal ALERT.

The error information storage unit 244 stores the read address RD_ADDR, which indicates the physical storage region on which the selected normal data NM_DATA are stored, as the error location information ER_INFO in response to the error determination signal ALERT. That is, if it is determined that the error occurs in the selected normal data NM_DATA in response to an activated error determination signal ALERT, the error information storage unit 244 stores the read address RD_ADDR as the error location information ER_INFO. In the other hand, if it is determined that the error does not occur in the selected normal data NM_DATA in response to an inactivated error determination signal ALERT, the error information storage unit 244 does not perform any operation.

The error information output unit 246 outputs the error location information ER_INFO stored on the error information storage unit 244 and the error determination signal ALERT generated from the error occurrence determination unit 242 to the external device.

Herein, it is not related to an operation of the semiconductor memory device to output the error determination signal ALERT and the error location information signal ER_INFO to the external device. Thus, the error information output unit 246 may be selectively included in the error detection unit 240.

The repair operation unit 260 performs a repair operation on the redundancy region 205 of the memory cell array 200. Thus, the repair operation unit 260 replaces the physical storage region for storing the selected normal data NM_DATA by the redundancy region 205 during a repair operation period, which is entered in response to the error determination signal ALERT. That is, if it is determined that the error occurs in the selected normal data NM_DATA in response to the activated error determination signal ALERT, the repair operation unit 260 performs a repair operation on the physical storage region of the memory cell array 200 on which the selected normal data NM_DATA are stored. Thus, the repair operation unit 260 controls the start of a repair operation of the semiconductor memory device in response to the activated error determination signal ALERT. Herein, after the error determination signal ALERT is activated, a start time of the repair operation may be adjusted by a designer using a memory register set (MRS) for adjusting an internal setting of the semiconductor memory device. Moreover, when a preset command signal is received, the start time of the repair operation period may be adjusted based on the activation of the error determination signal.

A circuit for adjusting a fuse value through an electrical control such as an electric fuse is used for replacing the physical storage region, which stores the selected normal data NM_DATA, by the redundancy region 205. That is, during the repair operation period, the physical storage region for storing the selected normal data NM_DATA is replaced by the redundancy region 205 through the manner for adjusting the fuse value based on the error location information ER_INFO. Herein, if the physical storage region for storing the selected normal data NM_DATA is the normal region 202 of the memory cell array 200, the repair operation unit 260 replaces the physical storage region by the first redundancy region 206. If the first redundancy region does not have a replaceable space, the repair operation unit 260 may replace the physical storage region by the second redundancy region 208. If the physical storage region for storing the selected normal data NM_DATA is the first redundancy region 206 of the memory cell array 200, the repair operation unit 260 may replace the first redundancy region 206 by the second redundancy region 208.

The write error occurrence determination unit 280 determines whether an error occurs in some bits corresponding to the normal data NM_DATA out of the input data IN_DATA based on the other bits corresponding to the error information data ER_DATA out of the input data IN_DATA received from the external device or not. The write error occurrence determination unit 280 generates a write error determination signal WT_ALERT. That is, the write error occurrence determination unit 280 determines whether the error occurs in the input data IN_DATA received from the external device or not. The some bits corresponding to the normal data NM_DATA out of the input data IN_DATA are encoded through the CRC operation and are compared with the other bits corresponding to the error information data ER_DATA out of the input data IN_DATA. In other words, the error occurrence may be determined through the aforementioned process.

If the error occurs in the input data IN_DATA, the write error determination signal WT_ALERT is activated, and if the error does not occur in the input data IN_DATA, the write error determination signal WT_ALERT is inactivated. That is, the write operation unit 210 may write the input data IN_DATA on the memory cell array 200 in response to the write error determination signal WT_ALERT. More specifically, if the write error determination signal WT_ALERT is activated, the write operation unit 210 does not write the input data IN_DATA on the memory cell array 200. If the write error determination signal WT_ALERT is inactivated, the write operation unit 210 writes the input data IN_DATA on the memory cell array 200.

As described above, the semiconductor memory device in accordance with an embodiment of the present invention may perform a repair operation based on an error occurrence by using error location information ER_INFO for indicating a storage location of the data having an error when an error occurrence of an output data is determined.

Figure 3:
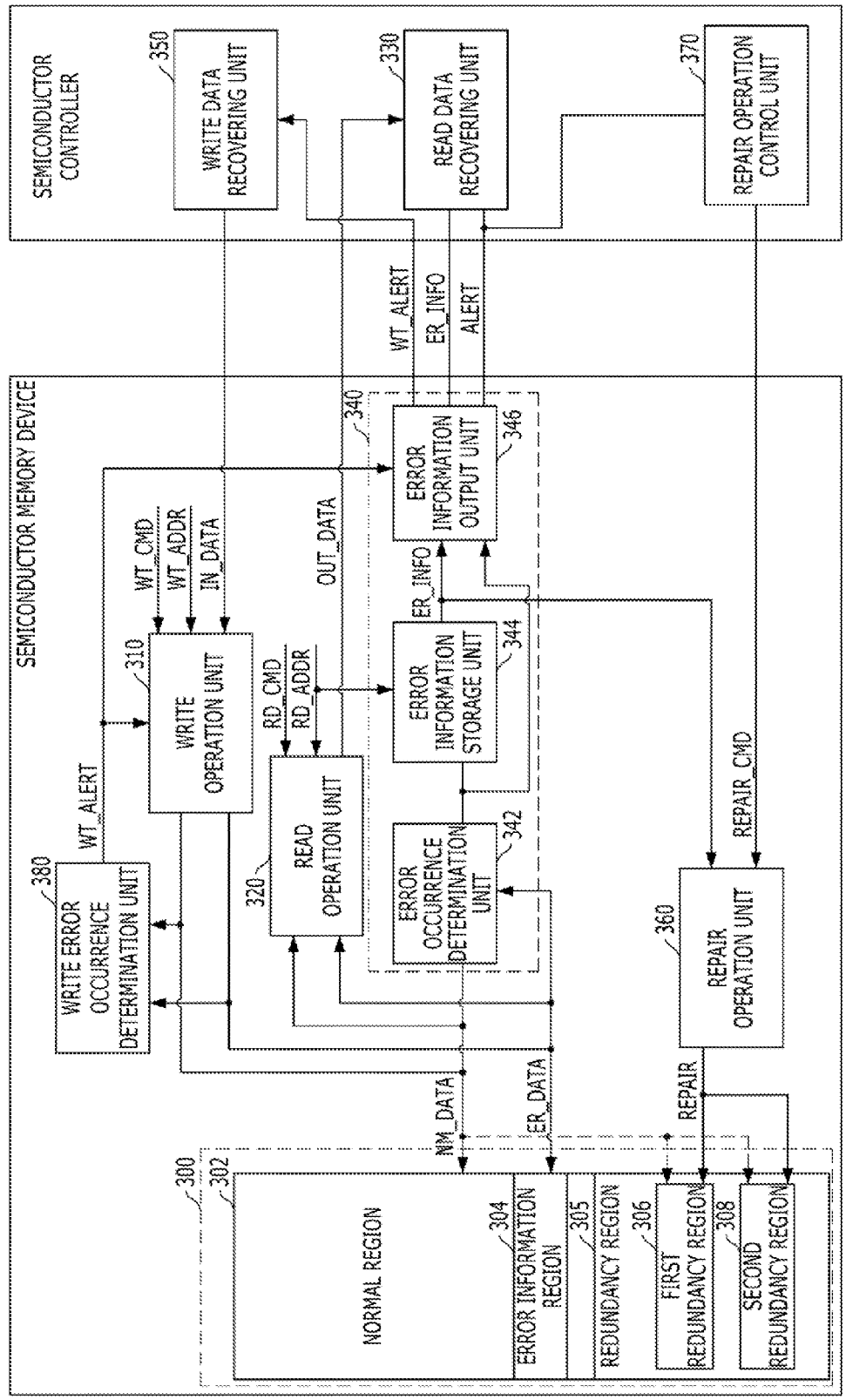
FIG. 3 is block diagram illustrating a semiconductor system in accordance with an exemplary embodiment of the present invention.

FIG. 3 is block diagram illustrating a semiconductor system in accordance with an exemplary embodiment of the present invention.

Referring to FIG. 3, a semiconductor system includes a semiconductor memory device and a semiconductor controller. The semiconductor memory device includes a memory cell array 300, a write operation unit 310, a read operation unit 320 an error detection unit 340, a repair operation unit 360, and a write error occurrence determination unit 380.

During a write operation period, the semiconductor memory device receives and stores a plurality of error information data ER_DATA for determining an error occurrence corresponding to a plurality of normal data NM_DATA. During a read operation period, the semiconductor memory device detects an error occurrence of the plurality of normal data NM_DATA in response to the plurality of error information data ER_DATA, and stores error location information ER_INFO, which indicates a physical storage region for storing the normal data NM_DATA having an error. The semiconductor memory device performs a repair operation on a physical storage region indicated by the error location information ER_INFO during the repair operation period.

The memory cell array 300 includes a normal region 302, an error information region 304, and a redundancy region 305.

The memory cell array 300 stores the plurality of normal data NM_DATA and the plurality of error information data ER_DATA corresponding to the plurality of normal data NM_DATA. The plurality of normal data NM_DATA are stored on the normal region 302. The plurality of error information data ER_DATA are stored on the error information region 304. The memory cell array 300 supports a repair operation using the redundancy region 305. That is, if an error occurs in the normal region 302 and the plurality of normal data NM_DATA are not stored on the normal region 302, the normal region 302 may be replaced by the redundancy region 305.

The plurality of normal data NM_DATA correspond to the plurality of error information data ER_DATA, respectively. For example, if a thousand number of normal data NM_DATA exist, a thousand number of error information data ER_DATA are used for determining the error occurrence on the thousand number of normal data NM_DATA. However, if each of the plurality of normal data NM_DATA has N number of bits, each of the plurality of error information data ER_DATA includes M number of bits less than N number of bits. For example, a single error information data ER_DATA having M number of bits may be generated by encoding a single normal data NM_DATA having N number of bits through the CRC operation. Thus, a size of the normal region 302 for storing the plurality of normal data NM_DATA is larger than a size of the error information region 304 for storing the plurality of error information data ER_DATA.

The redundancy region 305 of the memory cell array 300 supports a repair operation of the normal region 302. When the repair operation is performed, the plurality of normal data NM_DATA may be stored on the redundancy region 305. In general, since the redundancy region 305 is smaller than the normal region 302, some of the plurality of normal data NM_DATA stored on the normal region 302 may not be replaced through the repair operation.

The redundancy region 305 includes a first redundancy region 306 and a second redundancy region. When the repair operation on the normal region 302 is performed, the first redundancy region 306 is used for replacing the normal region 302 prior to the second redundancy region 308. That is, when an error occurs in the normal region 302, the first redundancy region 306 is preferentially used. When a replaceable space does not exist on the first redundancy region 306, the second redundancy region 308 is used for replacing the normal region 302. Moreover, if an error occurs in the first redundancy region 306, the second redundancy region 308 replaces the first redundancy region 306.

The write operation unit 310 stores some of a set number of bits as one of the plurality of normal data NM_DATA on the normal region 302 or the redundancy region 305 of the memory cell array 300 whenever input data IN_DATA having the set number of bits are received from the semiconductor controller during a write operation period. The others of the bits as one of the plurality of error information data ER_DATA are stored on the error information region 304 of the memory cell array 300. Herein, the write operation period is an operation period defined by a write command signal WT_CMD. That is, when the write command signal WT_CMD and a write address signal WT_ADDR are provided from the semiconductor controller, the semiconductor memory device enters the write operation period.

During the write operation period, some bits of the input data IN_DATA provided from the semiconductor controller are stored as the normal data NM_DATA on a physical storage region of the redundancy region 305 or the normal region 302 corresponding to the write address WT_ADDR.

During the write operation period, the other bits of the input data IN_DATA are stored as the error information data ER_DATA on the physical storage region of the error information region 304 corresponding to the write address WT_ADDR.

A single input data IN_DATA includes a signal normal data NM_DATA and a signal error information data ER_DATA, which have a number of bits and are to be stored on the normal regions 302 (or the redundancy region 305) and the error information region 304, respectively. That is, the signal input data IN_DATA is to be written through a plurality of write operations.

The read operation unit 320 selects one of the plurality of normal data NM_DATA, which are stored on the normal region 302 or the redundancy region 305 of the memory cell array 300, as a selected normal data NM_DATA. The read operation unit 320 selects one corresponding to the selected normal data NM_DATA out of the plurality of error information data ER_DATA, which are stored on the error information region 304 of the memory cell array 300, as a selected error information data ER_DATA. Output data OUT_DATA generated by combining the selected normal data NM_DATA and the selected error information data ER_DATA, are outputted to the semiconductor controller.

Herein, the read operation period is defined by a read command signal RD_CMD received from the semiconductor controller. That is, when the read command signal RD_CMD and the read address RD_ADDR are provided from the semiconductor controller, the semiconductor memory device enters the read operation period. During the read operation period, data, which are stored on a physical storage region corresponding to the read address RD_ADDR, out of the plurality of normal data NM_DATA stored on the normal region 302 or the redundancy region 305 of the memory cell array 300 are selected as the selected normal data NM_DATA. During the read operation period, data, which are stored on the physical storage region corresponding to the read address RD_ADDR, out of the plurality of error information data ER_DATA stored on the error information region 304 of the memory cell array 300 are selected as the selected error information data ER_DATA. Output data OUT_DATA generated by combining the selected normal data NM_DATA and the selected error information data ER_DATA are outputted to the semiconductor controller. Herein, the single output data OUT_DATA includes the selected normal data NM_DATA and the selected error information data ER_DATA, which have a number of bits and have been stored on the normal regions 302 (or the redundancy region 305) and the error information region 304, respectively. That is, the signal output data OUT_DATA is to be read through a plurality of read operations.

The error detection unit 340 detects an error on the plurality of normal data NM_DATA outputted from the normal region 302 or the redundancy region 305 in response to the plurality of error information data ER_DATA outputted from the error information region 304 during the read operation period. As a detected result, the error detection unit 340 stores error location information ER_INFO, which indicates a physical storage region of the normal region 302 or the redundancy region 305 on which the data having an error are stored.

The error detection unit 340 includes an error occurrence determination unit 342, an error information storage unit 344, and an error information output unit 346.

The error occurrence determination unit 342 determines whether an error occurs in the selected normal data NM_DATA corresponding to the read address RD_ADDR out of the plurality of normal data NM_DATA outputted from the normal region 302 or the redundancy region 305 in response to the selected error information data ER_DATA corresponding to the read address RD_ADDR out of the plurality of error information data ER_DATA outputted from the error information region 304 during the read operation.

For example, if a value of the selected error information data ER_DATA is same, as a value generated by encoding the selected normal data NM_DATA through the CRC operation, the error occurrence determination unit 342 determines that the error does not occur in the selected normal data NM_DATA, and inactivates an error determination signal ALERT. On the contrary, if the value of the selected error information data ER_DATA is not the same as the value generated by encoding the selected normal data NM_DATA through the CRC operation, the error occurrence determination unit 342 determines that the error occurs in the selected normal data NM_DATA, and activates the error determination signal ALERT.

The error information storage unit 344 stores the read address RD_ADDR, which indicates the physical storage region on which the selected normal data NM_DATA are stored, as the error location information ER_INFO in response to the error determination signal ALERT. That is, if it is determined that the error occurs in the selected normal data NM_DATA in response to an activated error determination signal ALERT, the error information storage unit 344 stores the read address RD_ADDR as the error location information ER_INFO. In the other hand, if it is determined that the error does not occur in the selected normal data NM_DATA in response to an inactivated error determination signal ALERT, the error information storage unit 344 does not perform any operation.

The error information output unit 346 outputs the error location information ER_INFO stored on the error information storage unit 344 and the error determination signal ALERT generated from the error occurrence determination unit 342 to the semiconductor controller. The error information output unit 346 outputs a write error determination signal WT_ALERT generated from the write error occurrence determination unit 380 to the semiconductor controller. The error information output unit 346 outputs the error information of the input and output data of the semiconductor memory device to the semiconductor controller.

The repair operation unit 360 performs a repair operation on the redundancy region 305 of the memory cell array 300. Thus, the repair operation unit 360 replaces the physical storage region for storing the selected normal data NM_DATA by the redundancy region 305 during a repair operation period, which is entered in response to a repair command signal REPAIR_CMD.

More specifically, a circuit for adjusting a fuse value through an electrical control such as an electric fuse is used as a manner for replacing the physical storage region, which stores the selected normal data NM_DATA, by the redundancy region 305. That is during the repair operation period, the physical storage region for storing the selected normal data NM_DATA is replaced by the redundancy region 305 through the manner for adjusting the fuse value based on the error location information ER_INFO. Herein, if the physical storage region for storing the selected normal data NM_DATA is the normal region 302 of the memory cell array 300, the repair operation unit 360 replaces the physical storage region by the first redundancy region 306. If the first redundancy region does not have a replaceable space, the repair operation unit 360 may replace the physical storage region by the second redundancy region 308. If the physical storage region for storing the selected normal data NM_DATA is the first redundancy region 306 of the memory cell array 300, the repair operation unit 360 may replace the first redundancy region 306 by the second redundancy region 308.

The write error occurrence determination unit 380 determines whether an error occurs in some bits corresponding to the normal data NM_DATA out of the input data IN_DATA based on the other bits corresponding to the error information data ER_DATA out of the input data IN_DATA received from the semiconductor controller. The write error occurrence determination unit 380 generates the write error determination signal WT_ALERT. That is, the write error occurrence determination unit 380 determines whether the error occurs in the input data IN_DATA received from the semiconductor controller. The some bits corresponding to the normal data NM_DATA out of the input data IN_DATA are encoded through the CRC operation and are compared with the other bits corresponding to the error information data ER_DATA out of the input data IN_DATA. In other words, the error occurrence may be determined through the aforementioned process.

If the error occurs in the input data IN_DATA, the write error determination signal WT_ALERT is activated, and if the error does not occur in the input data IN_DATA, the write error determination signal WT_ALERT is inactivated. That is, the write operation unit 310 may write the input data IN_DATA on the memory cell array 300 in response to the write error determination signal WT_ALERT. More specifically, if the write error determination signal WT_ALERT is activated, the write operation unit 310 does not write the input data IN_DATA on the memory cell array 300. If the write error determination signal WT_ALERT is inactivated, the write operation unit 310 writes the input data IN_DATA on the memory cell array 300.

The semiconductor controller includes a read data recovering unit 330, a write data recovering unit 350, and a repair operation control unit 370.

The read data recovering unit 330 recovers a value of the selected normal data NM_DATA out of the output data OUT_DATA based on the selected error information data ER_DATA out of the output data OUT_DATA when it is determined that the error occurs in the selected normal data NM_DATA in response to the activated error determination signal ALERT. Herein, since an algorithm for recovering the value of the selected normal data NM_DATA having the error through the CRC operation using the selected error information data ER_DATA is well known in the art, the detailed descriptions for the algorithm will be omitted.

When it is determined that the error occurs in the value of the predetermined bits corresponding to the normal data NM_DATA out of the input data IN_DATA inputted to the semiconductor memory device in response to the activated write error determination signal WT_ALERT, the write data recovering unit 350 recovers the value of the predetermined bits based on the other bits corresponding to the error information data ER_DATA out of the input data IN_DATA.

Herein, since an algorithm for recovering the value of the predetermined bits corresponding to the normal data NM_DATA having the error through the CRC operation using the other bits corresponding to the error information data ER_DATA out of the input data IN_DATA is well known in the art, the detailed descriptions for the algorithm will be omitted. The input data IN_DATA, which are recovered by the write data recovering unit 350 are provided to the semiconductor memory device.

The repair operation control unit 370 controls the repair operation period of the semiconductor memory device by selectively transmitting a repair command signal REPAIR_CMD to the semiconductor memory device in response to the error determined signal ALERT received from the semiconductor memory device. That is, the activation of the error determination signal ALERT received from the semiconductor memory device represents that the error occurs in the selected normal data NM_DATA received from the semiconductor memory device. Thus it is determined that the repair operation is to be performed on the physical storage region of the memory cell array 300 having the selected normal data NM_DATA, and the repair operation control unit 370 transmits the repair command signal REPAIR_CMD to the semiconductor memory device so that the semiconductor memory device enters the repair operation mode. On the contrary, the inactivation of the error determination signal ALERT received from the semiconductor memory device represents that the error does not occur in the selected normal data NM_DATA received from the semiconductor memory device. Thus, it is determined that the repair operation is not to be performed on the physical storage region of the memory cell array 300 having the selected normal data NM_DATA, and the repair operation control unit 370 does not transmit the repair command signal REPAIR_CMD to the semiconductor memory device so that the semiconductor memory device does not enter the repair operation mode.

As described above, the semiconductor memory device in accordance with an embodiment of the present invention may perform a repair operation based on an error occurrence by using error location information ER_INFO for indicating a storage location of the data having an error when an error occurrence of an output data is determined.

Moreover, the semiconductor memory device determines the error occurrence, and the semiconductor controller controls a recovering operation of the data having the error. Thus, a resource of the semiconductor memory device is used minimally and the error of the input and output data may be recovered in the semiconductor memory device.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a memory cell array including a normal region for storing a plurality of data, an error information region for storing a plurality of error information data corresponding to the plurality of data, respectively, and a redundancy region for replacing the normal region;
a write operation unit suitable for storing first bits of an input data as one of the plurality of data on the memory cell array and storing second bits of the input data as a corresponding one of the plurality of error information data on the error information region;
an error detection unit suitable for detecting an error on the plurality of data in response to the plurality of error information data, and storing an error location information, which indicates a storage region of a data having an error in the normal region, based on an error detection result; and
a repair operation unit suitable for replacing the storage region which is indicated by the error location information, by the redundancy region during a repair operation period.

2. The semiconductor memory device of claim 1, further comprising:
a read operation unit suitable for selecting one of the plurality of data stored on the memory cell array as a selected data, selecting one of the plurality of error information data corresponding to the selected data as a selected error information data, and outputting an output data generated by combining the selected normal data and the selected error information data.

3. The semiconductor memory device of claim 2, wherein the error detection unit comprises:
- an error occurrence determination unit suitable for generating an error determination signal by determining whether an error occurs in the selected data or not based on the selected error information data; and
- an error information storage unit suitable for storing a read address, which indicates where the selected data is stored in the normal, as the error location information in response to the error determination signal.

4. The semiconductor memory device of claim 3, wherein the error detection unit further comprises:
- an error information output unit suitable for outputting the error determination signal and the error location information.

5. The semiconductor memory device of claim 3, wherein the repair operation unit replaces the normal for storing the selected normal data by the redundancy region during the repair operation period, which is determined in response to the error determination signal.

6. The semiconductor memory device of claim 2, further comprising:
- a write error occurrence determination unit suitable for determining whether an error occurs in the first bits of the input data based on the second bits of the input data or not, and generating a write error determination signal.

7. The semiconductor memory device of claim 6, wherein the write operation unit stores the input data on the memory cell array in response to the write error determination signal.

8. The semiconductor memory device of claim 1, wherein the redundancy region includes a first redundancy region and a second redundancy region.

9. The semiconductor memory device of claim 8, wherein during the repair operation period, if the storage region is the normal region, the repair operation unit replaces the storage region by the first redundancy, and if the storage region is the first redundancy region, the repair operation unit replaces the storage region by the second redundancy region.

10. A semiconductor memory system, comprising:
- a semiconductor controller suitable for generating a plurality of input data each including a data and an error information data for determining an error occurrence on the data; and
- a semiconductor memory device comprises:
  - a memory cell array including a normal region for storing the plurality of data, an error information region for storing the plurality of error information data and a redundancy region for replacing the normal region;
  - a write operation unit suitable for storing first bits of an input data as one of the plurality of data on the memory cell array and storing second bits of the input data as a corresponding one of the plurality of error information data on the error information region, during the write operation period;
  - an error detection unit suitable for detecting the error occurrences on the plurality of data in response to the plurality of error information data during the read operation period, and storing the error location information based on the error occurrence detected result; and
  - a repair operation unit suitable for replacing the storage region, which is indicated by the error location information, by the redundancy region during the repair operation period,
- wherein the semiconductor controller controls the repair operation period of the semiconductor memory device based on an error occurrence detected result transmitted from the semiconductor memory device during the read operation period.

11. The semiconductor memory system of claim 10, wherein the semiconductor memory device further comprises:
- a read operation unit suitable for selecting one of the plurality of data stored on the memory cell array as a selected data, selecting one of the plurality of error information data corresponding to the selected data as a selected error information data, and outputting an output data generated by combining the selected data and the selected error information data, during the read operation period.

12. The semiconductor memory system of claim 11, wherein the error detection unit comprises:
- an error occurrence determination unit suitable for generating an error determination signal by determining whether an error occurs in the selected data or not based on the selected error information data;
- an error information storage unit suitable for storing a read address, which indicates where the selected data is stored in the normal or redundancy region, as the error location information in response to the error determination signal; and
- an error information output unit suitable for outputting the error determination signal and the error location information to the semiconductor controller.

13. The semiconductor memory system of claim 12, wherein the semiconductor controller controls the repair operation period of the semiconductor memory device by selectively transmitting a repair command signal to the semiconductor memory device in response to the error determination signal.

14. The semiconductor memory system of claim 13, wherein the semiconductor controller further comprises:
- a read data recovering unit suitable for recovering the selected data based on the selected error information data when it is determined that the error occurs in the selected data in response to the error determination signal.

15. The semiconductor memory device of claim 12, further comprising:
- a write error occurrence determination unit suitable for determining whether an error occurs in the first bits of the input data based on the second bits of the input data or not, and generating a write error determination signal, and
- wherein the error information output unit outputs the write error determination signal to the semiconductor controller.

16. The semiconductor memory system of claim 15, wherein the write operation unit stores the input data on the memory cell array in response to the write error determination signal.

17. The semiconductor memory system of claim 16, wherein the semiconductor controller further comprises:
- a write data recovering unit suitable for recovering and the first bits of the input data based on the second bits of the input data to be outputted to the semiconductor memory device when it is determined that the error occurs in the first bits of the input data in response to the write error determination signal.

18. The semiconductor memory system of claim 10, wherein the redundancy region includes a first redundancy region and a second redundancy region.

19. The semiconductor memory device of claim 18, wherein during the repair operation period, if the storage region is the normal region, the repair operation unit replaces the storage region by the first redundancy, and if the storage region is the first redundancy region, the repair operation unit replaces the storage region by the second redundancy region.

* * * * *